United States Patent [19]
Lee

[11] Patent Number: 6,048,787
[45] Date of Patent: Apr. 11, 2000

[54] BORDERLESS CONTACTS FOR DUAL-DAMASCENE INTERCONNECT PROCESS

[75] Inventor: William Wei-Yen Lee, Palo Alto, Calif.

[73] Assignee: Winbond Electronics Corp., Hsinchu, Taiwan

[21] Appl. No.: 09/149,266

[22] Filed: Sep. 8, 1998

[51] Int. Cl.[7] .................................................. H01L 21/441
[52] U.S. Cl. ........................ 438/625; 438/624; 438/637
[58] Field of Search .................................... 257/763, 764, 257/774, 773, 783, 784; 438/624, 625, 748, 750, 692, 695, 754

[56] References Cited

U.S. PATENT DOCUMENTS

| | | | |
|---|---|---|---|
| 5,300,813 | 4/1994 | Joshi et al. | 257/752 |
| 5,459,098 | 10/1995 | Maya | 437/173 |
| 5,595,937 | 1/1997 | Mikagi | 437/192 |
| 5,612,574 | 3/1997 | Summerfelt et al. | 257/783 |
| 5,654,589 | 8/1997 | Huang et al. | 257/763 |
| 5,674,781 | 10/1997 | Huang et al. | 437/192 |
| 5,731,642 | 3/1998 | Motsiff et al. | 257/529 |
| 5,736,457 | 4/1998 | Zhao | 438/462 |
| 5,739,579 | 4/1998 | Chiang et al. | 257/635 |
| 5,861,676 | 1/1999 | Yen | 257/776 |
| 5,897,379 | 4/1999 | Ulrich et al. | 438/754 |
| 5,935,762 | 8/1999 | Dai et al. | 430/312 |
| 5,969,425 | 10/1999 | Chen et al. | 257/774 |
| 5,981,374 | 11/1999 | Dalal et al. | 438/624 |
| 6,010,962 | 1/2000 | Liu et al. | 438/687 |

*Primary Examiner*—Charles Bowers
*Assistant Examiner*—Laura M. Schillinger
*Attorney, Agent, or Firm*—H. C. Lin Patent Agent

[57] ABSTRACT

For multiple layer interconnections using copper, the top interconnection layer and the via hole to the bottom layer are self-aligned on at least one side. The self-alignment eliminates the need for providing a border for the contact of the via hole to the interconnection. The self-alignment is accomplished by using a nitride mask, which defines one side of both the via hole and the interconnection. After the top surface of the copper interconnection is planarized, another layer of copper interconnection can be superimposed over the first interconnection in a similar manner.

9 Claims, 2 Drawing Sheets

BORDERLESS CONTACTS FOR DUAL-DAMASCENE INTERCONNECT PROCESS

BACKGROUND

This invention relates to interconnection system for semiconductor integrated Circuits—in particular to multilayer interconnections.

In the development of interconnection system for very large scale integration (VLSI) circuits, the devices have been shrunk to sub-micron dimensions. The speed of sub-micron transistors is very high, such that the speed of an integrated circuit (IC) is now limited by the interconnection rather than the transistor itself What limits the speed of the interconnection is the finite resistivity of the interconnection material. Traditionally, aluminum has been used in the past. However the resistivity of aluminum is higher than copper. Therefore, the trend today for high speed IC development is to use copper as interconnections. Another trend today for high packing density is to use multiple layer interconnections for complicated ICs.

One promising approach is the "dual damascene" interconnection technique, where a contact and an interconnection via hole are masked and etched in succession in oxide layers. The contact plug and the interconnection which buries the via hole are formed with one single metal deposition and single chemical-mechanical planarization process. The process is especially suitable for copper interconnection, because the copper cannot be readily etched by plasma, which is widely used for other etching processes in IC fabrication.

There are other process integration problems in fabricating this dual damascene interconnection. The difficulty arises when the second interconnection is masked and patterned after the first via hole for contacting the bottom is masked and patterned. Since the upper contact of the via hole invariably overlaps the interconnecting line, the photoresist for patterning the interconnection fills up the opening for the via hole in the oxide completely. During exposure, the photoresist in the opening experiences different focusing from the photoresist on top of the oxide due to the different amount of photoresist development and due to unevenness of the photoresist, the resultant interconnection pattern is distorted and dimensional control is very difficult. The problem also exists when the mask sequence is reversed.

Furthermore, in circuit design, a margin must be allowed around the contact of the upper via hole plug. Otherwise, the etched interconnection pattern may miss the contact. When a border is made around the contact to allow for misalignment, the density of the IC is compromised.

Another problem of using copper is atom migration due to diffusion.

SUMMARY

An object of this invention is to minimize the dimension of damascene interconnection for integrated circuits. Another object of this invention is to minimize the dimensional distortion for via holes and interconnections. Another object of this invention is to provide multiple layer damascene interconnections. Still another object of this invention is to simplify the damascene interconnection process. A further object of this invention is to provide diffusion barrier against copper atom migration.

These objects are achieved by aligning at least one side of the interconnection with the via hole connecting the interconnection to the bottom substrate. Self-alignment eliminates the need to provide a border to the contact between the via hole and the interconnection to prevent misalignment. The self-alignment is accomplished by using a nitride mask which serves to define at least one side of both the via hole and the interconnection. The nitride also serves as a diffusion barrier against copper atom migration.

Multiple layer interconnection can be added the first interconnection is a similar manner.

DETAILED DESCRIPTION OF THE PREFERRED EMBODIMENT

The approach is to fabricate a damascene interconnection with a contact via hole and the interconnection self-aligned on at one side. Nitride layer is used to define the pattern for both the via hole and the interconnection. The nitride also serves as CMP polishing stop as well as a etch stop during the etching step for processing a second layer of interconnection.

Figure 1A:
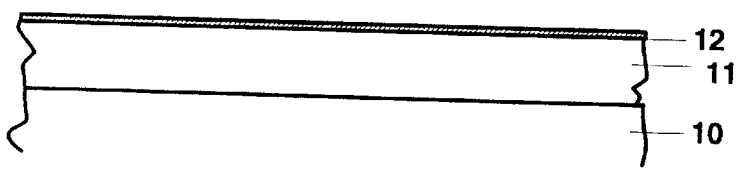
FIGS. 1a through g show the processing steps to fabricate one layer of damascene interconnection based on the present invention.
Figure 1B:
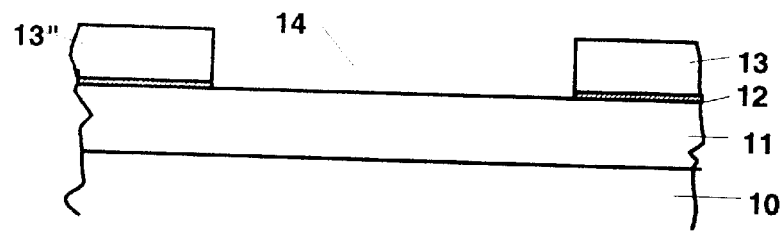
Figure 1C:
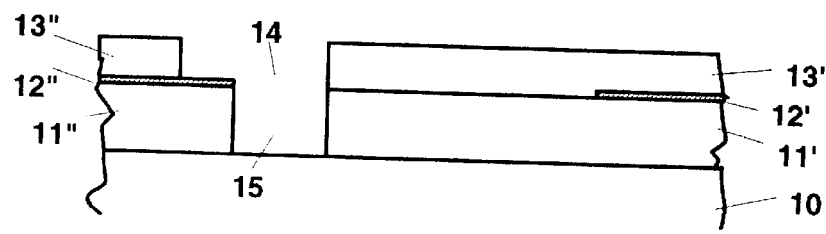
Figure 1D:
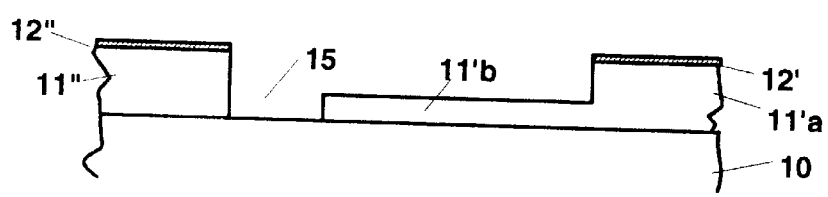
Figure 1E:
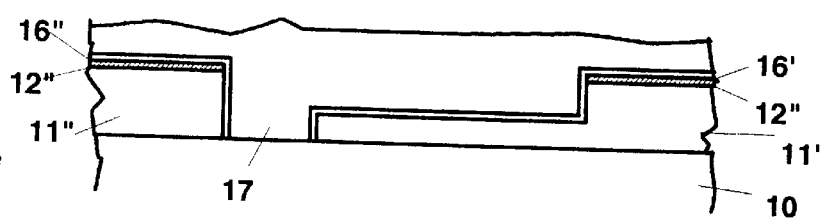
Figure 1F:
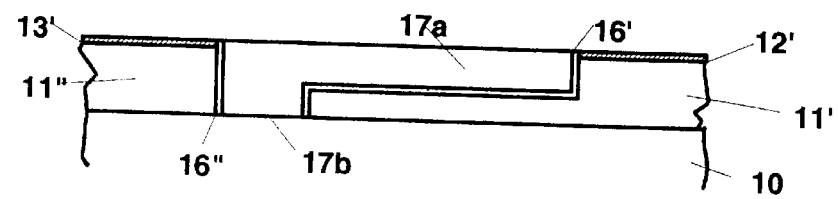
Figure 1G:
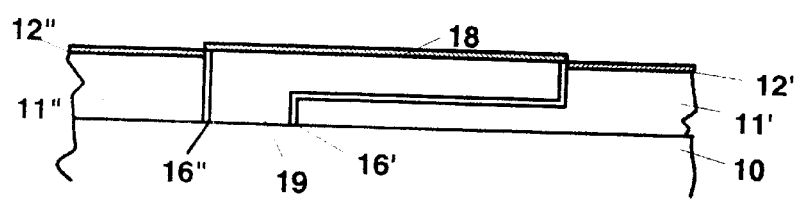

The processing steps for a single layer of copper interconnection is shown in FIGS. 1a 1g.

1) On an in-process wafer substrate 10 with or without a first level metal interconnection is deposited a thick layer of oxide 11 (1–1.5 $\mu$m) and a thin layer of nitride 12 (300–600 Angstroms) in succession as shown in FIG. 1a.

2) A photo-mask for the copper interconnection is used to open a window 14 and pattern the nitride for interconnection into two sections 12' and 12" with photoresist 13 as shown in FIG. 1b. Because of the difference in etch rate, the etching stops at the top surface of the oxide layer.

3) After the photoresist 13 is stripped, a second masking step is performed using a second photoresist 13' to pattern the via hole 15 as shown in FIG. 1c. The via pattern is oversized so that only one or more sides are defined by the via mask and the other sides to be defined by a metallization pattern in the nitride layer.

4) The via hole 15 is etched through with the fill thickness of the oxide 11 with reactive ion etching (RIE) as shown in FIG. 1c.

5) The second photoresist 13' is stripped. Using the nitride pattern 12' and 12" as a mask, the oxide layer 11' is etched a half way through its thickness to become a thinner oxide layer 11'b for the interconnection pattern as shown in FIG. 1d.

6) After depositing a barrier layer 16' and 16" of titanium nitride (TiN) of 500 Angstroms, copper 17 is electroplated in the cavities in the oxide until it is overfilled over the top of the structure as shown in FIG. 1e. This 17 layer serves both as an interconnection and a via contact to the bottom substrate 10. Note that the left side of the interconnection 17a and the left side of the via hole 17b are self-aligned. Thus there is no need to provide a border of the contact area of the via hole to the interconnection to prevent misalignment.

7) The overfilled metal is polished off using the chemical mechanical planarization (CMP) technique until the copper surface 14 is planarized with surfaces 16' and 16" of the nitride layer.

8) A thin barrier layer 18 of TiN is then deposited selectively by electrodeless deposition on the top metal surface as shown in FIG. 1g.

Note that the nitride layer 12" serves to define one side of both the via pattern 117b and the interconnection 17a. The nitride also serves as a diffusion barrier against copper atom migration. The nitride layer further acts as a etch stop when more metal layers are fabricated of the structure in FIG. 1g.

Figure 2A:
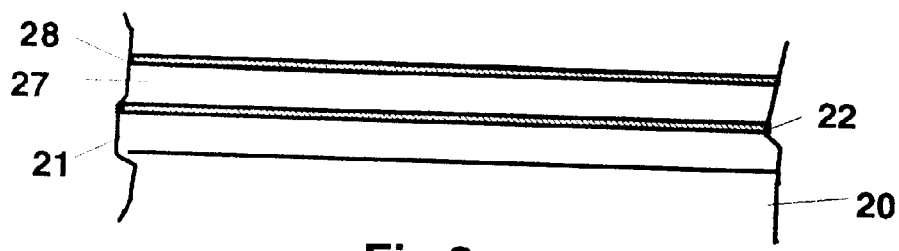
FIGS. 2a through 2d show the processing steps to fabricate multiple layer damascene interconnections based on the present invention.

A second embodiment of this present for two metal layers of interconnection is shown in FIGS. 2a–2d. The process is as follows:

1) On an in-process wafer with first metal interconnection 20 already in place, a four layered dielectric film stack of oxide 21 (0.7–1.0 μm), a thin nitride layer 22 (300–600 Angstroms), a second oxide layer 27 (0.7–1.0 μm) and a second nitride layer 28 (300–600 Angstroms) are deposited in succession as shown in FIG. 2a.

Figure 2B:
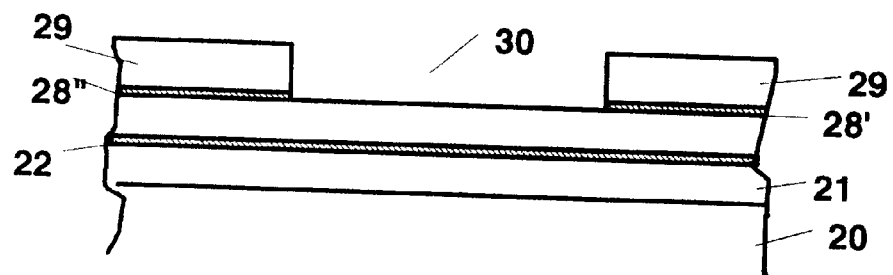

2) A photo-masking step for the second metal interconnection is applied, and the second nitride layer 28 is etched with plasma to open a window 30 for subsequent second metal interconnection. The photoresist pattern 29', 29" is then hardened with ultra-violet light. as shown in FIG. 2b.

3) A second photo-masking 32', 32" step for the via hole 31 is applied over the first photoresist pattern. The via hole pattern is oversized, so that only one side (the right-hand side in FIG. 2c) or more sides are defined by the via hole mask. The other sides (such as the left-hand side in FIG. 2c) are defined by the previous second metal interconnection mask, and is therefore self-aligned.

Figure 2C:
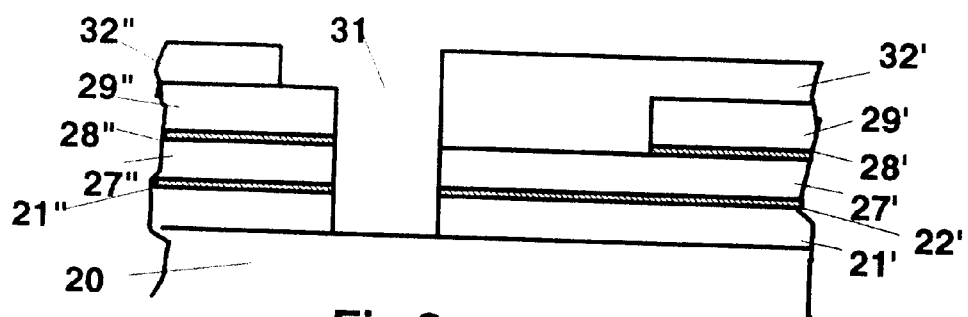

4) A The via hole 31 is etched through the full thickness of the four layered stack of second nitride layer 28", second oxide layer 27, the first nitride layer 22 and first oxide layer 21 with reactive ion etching (RIE), changing the etching chemicals at layer boundaries until the top of the first metal lines 20 is reached as shown in FIG. 2c.

5) Both photoresist patterns 32', 32" and 29', 29" are stripped. Using the top nitride layer 28' and 28" as a mask, the interconnection pattern is etched in the top oxide 27 to become oxide layers 27' and 27" until the top surface of the middle nitride 22' is reached as shown in FIG. 2d.

Figure 2D:
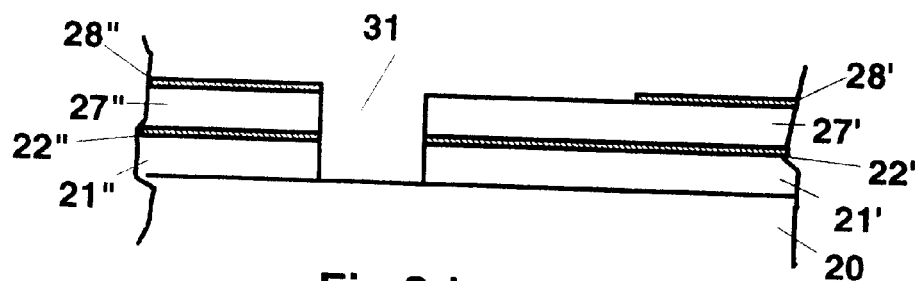

6) The rest of the steps are the same as the first embodiment for the single layer This second embodiment has the further advantage over the first embodiment in that the etch step in FIG. 2d stops at the nitride layer 22' in the middle of the dielectric. The thickness of the second metal interconnection, which is equal to the oxide 27' thickness plus the nitride 28' thickness, is precisely defined.

While the preferred embodiments of the invention have been shown and described, it will be apparent to those skilled in the art that various modifications may be made in the embodiments without departing from the spirit of the present invention. Such modifications are all within the scope of this invention.

What is claimed is:

1. A method of fabricating damascene interconnections on an integrated circuit substrate, comprising the steps of:

growing a first oxide layer over the substrate;

growing and patterning a first tin-nitride layer for a first interconnection;

patterning a via hole at least one edge of said first tin-nitride layer as a mask for self-alignment with the first interconnection;

etching the first oxide layer partway in depth using the first tin-nitride layer as a mask;

growing a barrier layer over the surfaces of the first oxide layer and the first tin-nitride layer;

filling the windows of the via hole and the first interconnection with copper, formed by electroplating; and planarizing the surfaces of the copper and the first tin-nitride layer.

2. A method as described in claim 1, wherein said oxide layers are silicon oxide layers.

3. A method as described in claim 1, wherein said planarizing step is implemented with chemical-mechanical planarization technique.

4. A method as described in claim 1, wherein said barrier layer is a second nitride layer.

5. A method as described in claim 1, further comprising the steps of growing a second interconnection over said first interconnection and providing a second via hole for connecting said first interconnection with said second interconnection.

6. A method as described in claim 5, further comprising the steps of:

growing a third tin-nitride over the first interconnection;

growing a second oxide layer over the third tin-nitride layer;

growing a fourth tin-nitride layer over the second oxide as mask for the second via hole;

growing a third oxide layer over the fourth tin-nitride layer;

growing a fifth tin-nitride layer over the third oxide layer aligned at least one side with the fourth tin-nitride layer as mask for the second interconnection;

patterning the second interconnection in the third oxide layer;

patterning the second interconnection in the third oxide layer;

patterning the second via hole in the second oxide; and filling the windows of the second interconnection and the second via hole with metal.

7. A method as described in claim 6, further comprising a second planarizing step for planarizing the surface of said second interconnection.

8. A method as described in claim 6, wherein said metal is copper.

9. A method as described in claim 6, wherein said second oxide layer and said oxide layer are silicon oxide.

* * * * *